United States Patent
El-Wardany et al.

(10) Patent No.: US 11,097,487 B2
(45) Date of Patent: Aug. 24, 2021

(54) APPARATUS AND METHOD FOR CONTROLLING TOLERANCE OF COMPOSITIONS DURING ADDITIVE MANUFACTURING

(71) Applicant: Hamilton Sundstrand Corporation, Charlotte, NC (US)

(72) Inventors: Tahany Ibrahim El-Wardany, Vernon, CT (US); Joseph V. Mantese, Ellington, CT (US); Abhijit Chakraborty, West Hartford, CT (US); Paul Attridge, Colchester, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 366 days.

(21) Appl. No.: 16/230,354

(22) Filed: Dec. 21, 2018

(65) Prior Publication Data
US 2020/0198246 A1 Jun. 25, 2020

(51) Int. Cl.
*B29C 64/153* (2017.01)
*G06F 30/00* (2020.01)
(Continued)

(52) U.S. Cl.
CPC ............ *B29C 64/393* (2017.08); *B22F 10/20* (2021.01); *B29C 64/153* (2017.08);
(Continued)

(58) Field of Classification Search
CPC ... B29C 64/393; B29C 64/153; B29C 64/371; B22F 10/20; B22F 10/30; G06F 30/00;
(Continued)

(56) References Cited

U.S. PATENT DOCUMENTS

2012/0128863 A1* 5/2012 Nguyen .................. B05D 7/02
427/2.3
2016/0047255 A1* 2/2016 Vargas .................. F01D 21/045
60/805
(Continued)

FOREIGN PATENT DOCUMENTS

| WO | 2013/018823 A1 | 2/2013 |
| WO | 2016/080459 A1 | 5/2016 |

(Continued)

OTHER PUBLICATIONS

Extended European Search Report for EP Application No. 19217983.6, dated May 7, 2020, 8 pages.

*Primary Examiner* — Michael J Brown
(74) *Attorney, Agent, or Firm* — Kinney & Lange, P.A.

(57) ABSTRACT

An additive manufacturing system includes an additive manufacturing (AM) device, a first sensor device, and a compute device. The AM device is configured to form a bulk component in a layer-by-layer manner, by at least iteratively depositing a first layer of raw material onto a working surface in a deposition chamber, consolidating the initial layer into an initial additive portion of the bulk component, then forming subsequent additive portions of the bulk component by depositing and consolidating a subsequent plurality of layers of the raw material onto the first additive portion. The first sensor device is configured to measure an actual composition of at least one first byproduct portion formed upon consolidation of one of the first or subsequent layers of raw material in the deposition chamber. The compute device includes a processor and a memory, and is communicatively coupled to the additive manufacturing device and first sensor device. The additive manufacturing device and compute device provide an in situ sensor analysis of the component while in a formation state during a build (Continued)

process by comparing an actual composition of the at least one first byproduct portion to an expected composition range stored in the memory.

19 Claims, 3 Drawing Sheets

(51) Int. Cl.
| | |
|---|---|
| *B33Y 30/00* | (2015.01) |
| *B29C 64/393* | (2017.01) |
| *B29C 64/371* | (2017.01) |
| *B22F 10/20* | (2021.01) |
| *B22F 10/30* | (2021.01) |
| *B33Y 10/00* | (2015.01) |
| *B33Y 40/00* | (2020.01) |
| *B33Y 50/02* | (2015.01) |
| *B33Y 70/00* | (2020.01) |

(52) U.S. Cl.
CPC ............ *B29C 64/371* (2017.08); *G06F 30/00* (2020.01); *B22F 10/30* (2021.01); *B33Y 10/00* (2014.12); *B33Y 30/00* (2014.12); *B33Y 40/00* (2014.12); *B33Y 50/02* (2014.12); *B33Y 70/00* (2014.12)

(58) Field of Classification Search
CPC ......... B33Y 10/00; B33Y 30/00; B33Y 40/00; B33Y 50/02; B33Y 70/00; G05B 2219/49134; G05B 2219/49023; G05B 2219/49008; G05B 2219/49018; G05B 2219/49007; G05B 19/4099
USPC ........................................................ 700/117
See application file for complete search history.

(56) References Cited

U.S. PATENT DOCUMENTS

| | | | |
|---|---|---|---|
| 2017/0066051 A1* | 3/2017 | Ackelid | ................ B22F 3/1017 |
| 2017/0312821 A1* | 11/2017 | DeFelice | ............ B23K 26/0006 |
| 2017/0348770 A1* | 12/2017 | Kwon | .................... B33Y 10/00 |
| 2018/0071821 A1* | 3/2018 | Crear | ..................... G01N 33/00 |

FOREIGN PATENT DOCUMENTS

| | | |
|---|---|---|
| WO | 2018/017581 A1 | 1/2018 |
| WO | WO2018/165381 A1 | 9/2018 |

* cited by examiner

APPARATUS AND METHOD FOR CONTROLLING TOLERANCE OF COMPOSITIONS DURING ADDITIVE MANUFACTURING

BACKGROUND

The disclosure relates generally to additive manufacturing and more specifically to maintaining additively manufactured compositions within desired limits during the build process.

Conventional additive manufacturing processes have limited or no closed loop controls, and therefore rely on final material property assessments of a finished manufactured part or product. Specifically, conventional additive manufacturing utilizes post deposition analysis to provide these assessments.

Additive manufacturing (AM) provides significant advantages over existing manufacturing techniques. However, relationships between materials processing, microstructure, and bulk properties are some of the main challenges because metallic parts produced by AM are susceptible to a number of factors not seen in conventional bulk processing. For one, compositional changes (such as between the raw material and bulk component) can occur due to higher or lower than expected evaporation of certain alloying elements, particularly those with elements having substantially different pressures.

Variation in elemental percentages lead to a lack of process repeatability and reproducibility, and often affect consistency and uniformity of bulk material properties and performance. Currently attempts to design of new materials (especially alloys with volatile constituents such as boron, phosphorous, etc.) for AM cannot be met unless high fidelity predictive models can be exploited.

One such example is to design the type of precipitates and corresponding kinetics associated with solid-state transformations that could have a beneficial or deleterious effects related to the residual stress, microstructure evolution and mechanical properties such as low and high cycle fatigue resistance. However, extensive modeling of the AM process often requires the understanding of the different process parameters effects on material compositional change, which previously could only be achieved through proper monitoring of the material vaporization phenomenon. In addition, sometimes the powdered materials do not deposit with the same efficiency as the starting powders or sources. This monitoring system and method of controlling material properties in situ is still very limited even in state-of-the-art AM processes such as those with limited closed loop control.

Therefore, more often than not, post deposition assessment of material properties can only be ascertained through the use of "witness" or sacrificial coupons that are formed along with the bulk component(s), then assessed post build to avoid destroying the end product. This latter approach does not easily lend itself for closed-loop-control, nor does it prevent the loss of a component that is discovered only after the fact to have a critical flaw. No available system is known to use in situ change of the raw material elements to control the consolidated metal alloy and corresponding properties.

SUMMARY

An additive manufacturing system includes an additive manufacturing (AM) device, a first sensor device, and a compute device. The AM device is configured to form a bulk component in a layer-by-layer manner, by at least iteratively depositing a first layer of raw material onto a working surface in a deposition chamber, consolidating the initial layer into an initial additive portion of the bulk component, then forming subsequent additive portions of the bulk component by depositing and consolidating a subsequent plurality of layers of the raw material onto the first additive portion. The first sensor device is configured to measure an actual composition of at least one first byproduct portion formed upon consolidation of one of the first or subsequent layers of raw material in the deposition chamber. The compute device includes a processor and a memory, and is communicatively coupled to the additive manufacturing device and first sensor device. The additive manufacturing device and compute device provide an in situ sensor analysis of the component while in a formation state during a build process by comparing an actual composition of the at least one first byproduct portion to an expected composition range stored in the memory. The expected composition range is determined based on at least a first approximation of byproducts expected to remain after consolidating the initial or subsequent layers of raw material powder. If the actual composition falls outside of the expected composition range, the compute device is configured to perform at least one corrective action that includes directing the additive manufacturing device to deposit at least one subsequent layer of raw material having a modified composition different from at least one of a previously deposited raw material composition or the initial layer of raw material to compensate for the variance in actual alloy composition.

An embodiment of a method for operating an additive manufacturing apparatus includes in situ analysis of a component being formed by the apparatus. The method includes (a) depositing an initial layer of raw material having a composition corresponding to an initial approximation of a desired bulk composition of the component being formed; (b) consolidating the deposited initial layer of raw material to form at least an initial additive portion of the component; and at least one first byproduct portion. The method also includes, by at least one sensor device, measuring an actual composition of the at least one first byproduct portion, during or immediately after the consolidating step. The actual composition of the at least one first byproduct portion is analyzed, and includes comparing the actual composition to an expected composition range. The expected composition range is determined based on at least the initial approximation of the desired bulk composition, thereby determining if the actual composition falls within or outside the expected composition range. If the actual composition falls within the expected composition range, immediately repeat the steps to form a subsequent additive portion of the bulk component and at least one subsequent byproduct portion. If the actual composition falls outside of the expected composition range, prior to repeating at least steps (a)-(d), performing at least one corrective action which includes depositing at least one subsequent layer of raw material having a modified composition different from at least one of the first raw material composition and a previously deposited raw material composition. The method continues by repeating the steps until the component is substantially complete, wherein for each iteration the initial approximation of a desired alloy composition in the raw material is updated based on a variance between actual and expected byproduct composition.

The present summary is provided only by way of example, and not limitation. Other aspects of the present disclosure will be appreciated in view of the entirety of the present disclosure, including the entire text, claims, and accompanying figures.

Figure 1:
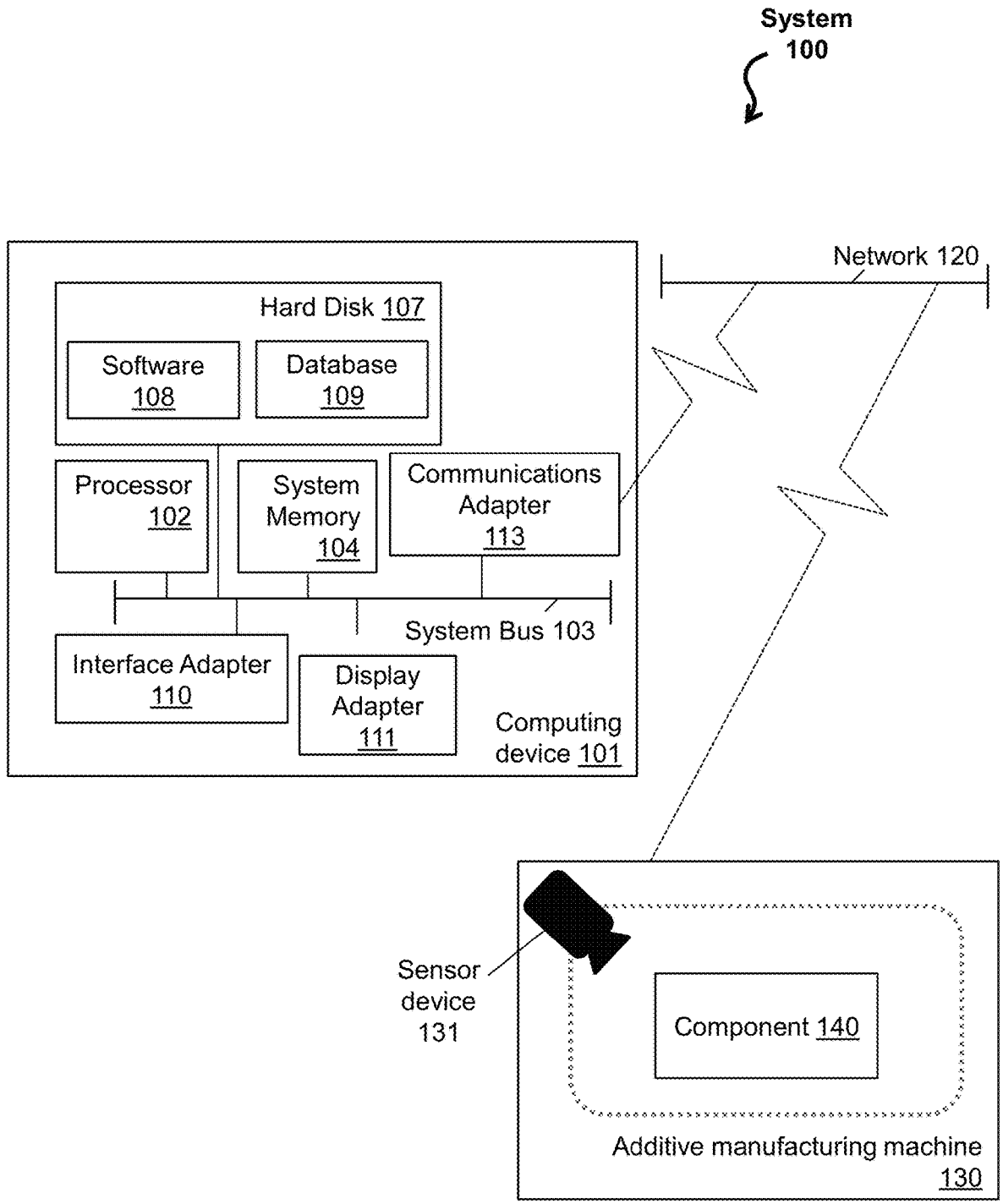
FIG. 1 depicts a system according to one or more embodiments

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

Metal (or other elemental species) can be measured during an X-ray diffraction (XRD) pattern analysis taken from the region of interest during metal deposition. Current methods for vapor metal analyses include total reflection x-ray fluorescence (TXRF), vapor phase decomposition total reflection x-ray fluorescence (VPD-TXRF), vapor phase decomposition inductively coupled plasma mass spectrometry (VPDICP-MS) and synchrotron radiation total reflection x-ray fluorescence (SR-TXRF), an example of the system structure is presented in FIG. 1 and the output can be obtained as images or XRD pattern of metal intensity as shown in FIG. 2.

The present disclosure relates to (1) a miniature X-ray source; (2) an X-ray detector including peak detection and exceedance; (3) a means of line scanning; (4) a real time X-ray assessment model and associated algorithms for measurements of metal intensity; (5) correlation models to define changes of alloy element percentage based on measured intensity, (6) a system for readjusting of powder alloying elements in the next deposited layer; and (7) feed forward and back for continuous adaptability and alloy elements corrections. Data collected according to the present disclosure can be used for fast design of new alloys for AM.

Conventional additive manufacturing devices are rapidly maturing and being adopted for flexible manufacturing. However, part-to-part variation, non-uniformity of properties across finished manufactured parts or products, and local or extended defects are significant shortcomings in scaling up conventional additive manufacturing processes to achieve high volume customized production.

In general, additive manufacturing is a three-dimensional object production process utilizing a computer aided design (CAD) file. Generally, a variety of materials, ranging from polymer composites, metals, ceramics, food, foams, gels, alloys, and the like, can be deposited as a raw material by a tool or feeder according to the data in the CAD file. The raw material is heated layer-by-layer using an electric or other energy beam to consolidate each layer of the material in place. The location of the deposited materials as the tool or feeder moves according to the computer design file is referred to as a tool path.

One issue is that conventional additive manufacturing processes have limited or no closed loop control to ensure repeatability or correction of defects during production. Therefore, to date, the only technically and economically feasible way to assess final material properties of the finished bulk components is through post deposition analysis. Common analyses include destructive analysis of sacrificial witness coupons formed alongside the bulk component(s) and/or time-consuming non-destructive inspection techniques of each and every finished part. Neither approach can be performed until the entire build process is finished. Therefore, post deposition analyses do not allow a manufacturer to change or adapt properties during manufacturing to correct or minimize errors and avoid waste.

Turning now to an overview of the aspects of the present disclosure, one or more embodiments of the disclosure address the above-described shortcomings of the conventional additive manufacturing by providing, via a system, a method, and/or an apparatus (referred to as a system, herein, for brevity), material deposition processes including in situ sensor analysis.

Efforts of certain inventors on this matter have resulted in apparatus and methods for in situ sensor analysis of the material deposition processes, which extracts physical properties directly from a component while in a formation state during additive manufacturing. The material deposition processes, then, feed forward and back these physical properties to the additive manufacturing for continuous adaptability. The technical effects and benefits of embodiments of the material deposition processes herein include determining these physical properties during the formation state of the component and, thus, enabling corrective actions, such as altering additive manufacturing depositions, to achieve pre-specified material requirements. Examples of such implementing direct measurements of the in-process bulk material are described in a copending U.S. Patent Application No. 16/166,931 entitled "IN SITU MONITORING OF STRESS FOR ADDITIVELY MANUFACTURED COMPONENTS", naming Joseph V. Mantese and Abhijit Chakraborty as co-inventors, filed on or about Oct. 22, 2018, and is herein incorporated by reference in its entirety. The incorporated application is assigned to Hamilton Sundstrand Corporation of Charlotte, N.C., U.S.A, and all inventors named in the instant application are obligated under their employment to assign all rights to the instant application to Applicant Hamilton Sundstrand Corporation.

The instant disclosure is based on monitoring primarily vapor and/or other byproducts present during consolidation of raw materials into a bulk material. Certain materials may be lost during the deposition process, either through vaporization, or merely because they do not deposit as efficiently as other constituents. Particularly, vulnerability of various alloys elements to thermal load and evaporation, as well as predisposition of different alloys to AM induced compositional changes are examined. These are aimed at consistently and reliably achieving compositionally sound and well bonded parts. This disclosure describes a method and system for controlling metal compositions and properties in the formation state of the component and takes corrective action or alters the powder compositions in situ during the additive manufacturing deposition process, thus achieving a component more frequently meeting the specified range of material composition and microstructural requirements. This approach described herein will reduce the variability in the products, as the alloys elements and weights will be far more consistent within each part, and across multiple parts.

Figure 2:
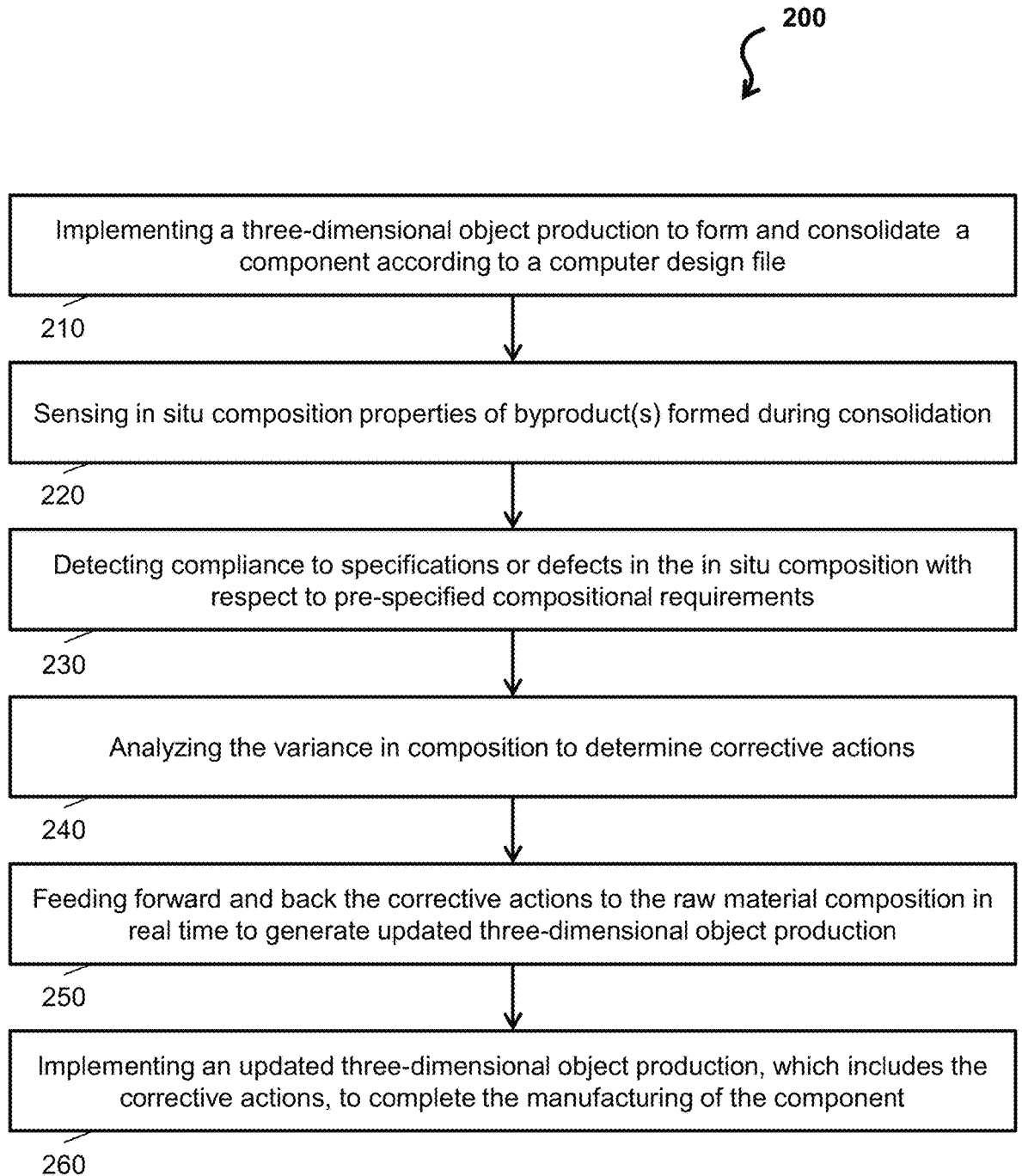
FIG. 2 depicts a process flow according to one or more embodiments

Turning now to FIG. 1, example system 100 is configured to implementing teachings contained herein according to one or more embodiments. In this example embodiment, system 100 includes compute device 101, which can be for example, an electronic computer framework comprising and/or employing any number and combination of computing device and networks utilizing various communication technologies. Compute device 101 can be easily scalable, extensible, and modular, with the ability to change to different services or reconfigure some features independently of others.

Compute device 101 can include processor(s) 102, each having one or more central processing units (CPUs). Processor 102, also referred to as a processing circuit, microprocessor, and/or computing unit, can be coupled via system bus 103 to system memory 104 and one or more other components. System memory 104 includes read only memory (ROM) and/or random access memory (RAM). ROM can be coupled to the system bus 103 and may include a basic input/output system (BIOS), or other suitable circuitry and instructions to control basic functions of system 100. RAM can take various physical and/or virtual forms but generally operates as read-write memory coupled to system bus 103 for use by processor 102 to assist in performing one or more tasks.

Compute device 101 optionally includes local and/or remote hard disk 107, and/or other optional tangible storage medium 107 for long-term storage of software 108 and database 109. Software 108 can be stored as instructions for execution by processor 102 (e.g., process flows shown in FIGS. 2-3). Database 109 includes various data structures, variables, values, etc. to support and be used by operation of software 108. Examples of items stored on the database 109 include computer design files, pre-specified material requirements, assessment models, assessment algorithms, and the like.

To further facilitate operation based on a particular architecture, compute device 101 can include one or more adapters (e.g., hard disk controllers, network adapters, graphics adapters, etc.) that interconnect and support communications between processor 102, system memory 104, hard disk 107, and/or other components of system 100 (e.g., peripheral and external devices). In one or more embodiments, the one or more adapters (not shown) can be connected to one or more I/O buses that are connected to the system bus 103 via an intermediate bus bridge, and the one or more I/O buses can utilize common protocols, such as Peripheral Component Interconnect (PCI). Compute device 101 can also include various user interfaces, such as interface adapter 110 interconnecting a keyboard, a mouse, a speaker, a microphone, etc. to system bus 103. Display adapter 111 interconnects system bus 103 to a display and can include a graphics controller such as for display and management of a graphic user interface. Communications adapter 113 interconnects the system bus 103 with network 120 enabling system 100 to communicate with other systems, devices, data, and software, such as an additive manufacturing device 130.

Additive manufacturing device 130 generally includes a processor, a memory, tool/feeder, and other machining parts that are not shown for brevity. While shown separately, compute device 101 and additive manufacturing device 130 can be integrated into a single apparatus, which further comprises at least one sensor device 131, as described in detail below. Sensor device(s) 131 can communicate via any interface, such as controller area network (CAN), local interconnect network (LIN), direct I/O interface, analog to digital (A/D) interface, digital to analog (D/A) interface, or any other interface specific to input, to compute device 101 via network 130, along with a processor, a memory, and machining parts of the additive manufacturing machine 130. Note that sensor device 131 is representative of one or more sensors of the same or varying type, each of which is capable of extracting physical properties of the component 140 in a formation state during its additive manufacturing as well as, inter alia, signaling compute device 101 to perform real time adjustments of raw material composition in a feed forward and/or feed backward manner in response to the parameters and signals discussed herein.

Additive manufacturing device 130 is configured to manufacture component 140 via material deposition processes that include in situ sensor analysis and control of the bulk composition at least in part by sensing a composition of the byproduct(s) resulting from each consolidation of raw material powder, and comparing that sensed byproduct composition to an expected byproduct composition. Variance between the two can indicate corresponding variance between the actual composition of the additive/bulk material layer and the expected composition of same.

To this end, sensor device(s) 131 can be any suitable device such as a transducer and/or a generator. In general, a transducer can be any detector that converts variations in a physical quantity into an electrical signal. The generator (also known as a source) of the sensor device 131 can be any mechanism that, in response to electrical signals, generates a wave, which itself is detectable or a reflection thereof is detectable by the transducer.

For measuring alloy and/or byproduct composition during the build/formation process, a miniaturized X-ray diffraction (XRD) system can be used as at least part of sensor device 131. Generally, this will include one or more, preferably miniature, X-ray sources, a correspondingly sized X-ray detector capable of identifying peak detection and exceedance, and a means of line scanning. In accordance with one or more embodiments, the at least one sensor device 131 includes an X-ray source and X-ray detector that together acquire a full or partial X-ray diffraction signal or pattern that is analyzed to indirectly determine the in situ physical properties via composition. Further, the X-ray source and the X-ray detector can be directed to detect a small portion of the full X-ray diffraction pattern, such that a single peak with a particular intensity and width representing the detection.

The controller can be programmed with, or have accessible, real time X-ray assessment model and associated algorithms for measurements of metal and/or byproduct intensity, as well as correlation models to define changes of alloy element percentage based on measured intensity versus that which is expected under normal circumstances. The resulting output is directed to a system for readjusting powder alloying elements in the next deposited layer as well as means for feeding data forward and back (e.g., closed loop control) for continuous adaptability and alloy element corrections. In certain embodiments, additional powder dispensers/hoppers can be provided for each element (or at least those most expected to require continuous adjustment to further refine and expedite in situ response to changes needed to achieve a suitable or ideal material composition. Collected data can also be stored and subsequently analyzed to both refine future processes and even can be used to expedite design of new alloys for AM that were previously subject to excess variation and scrap.

Other examples of physical quantities measured by additional optional sensor devices 131 can include local strain, yield strength, density, crystallite size, porosity, defect density, crystalline orientation, texture, compositional variation, temperature, local porosity, optical density, reflectance (e.g., note that because some of these quantities are difficult to extract, the sensor device 131 provides added benefits for in situ analysis). Details on implementation of these additional elements are described in detail in the incorporated application.

Thus, as configured in FIG. 1, the operations of the software 108, the database 109, and the additive manufacturing machine 130 (e.g., the system 100) are necessarily rooted in the computational ability of the processors therein to overcome and address the herein-described shortcomings of the conventional additive manufacturing. In this regard, the software 108 and the data 109 improve manufacturing operations of the additive manufacturing machine 130 by reducing and eliminating errors in manufacturing, part-to-part variation, non-uniformity of properties, and local or extended defects for high volume production.

FIG. 2 depicts a process flow 200 of according to one or more embodiments. The process flow 200 is an example operation of implementing material deposition processes including in situ sensor analysis and building of one or more components (e.g., component 140) by analyzing composition during additive manufacturing of the component(s).

Process flow 200 begins at block 210, where a material deposition process is implemented to form a component (e.g., component 140 in FIG. 1) via an additive manufacturing device (e.g., device 130 in FIG. 1) according to a computer design file such as but not limited to a CAD file.

At block 220, in situ composition and one or more related physical properties of the component are sensed via one or more sensing devices during the material deposition process. In accordance with one or more embodiments, the one or more sensing devices can include an X-ray detector that acquires an X-ray diffraction (XRD) pattern corresponding to a composition in the deposition chamber while the component is in a formation state (prior to completion). Various parameters of the XRD pattern are analyzed (e.g., by software 108 of compute device 101 in FIG. 1) to determine or closely estimate the composition of an additive portion of the component based on the difference between actual and expected alloy and/or byproduct composition.

As noted relative to FIG. 1, additional in situ physical properties or material parameters, such as hardness, local strain, yield strength, density, crystallite size, porosity, defect density and compositional variation (among other properties) can also be periodically or continuously measured by separate sensing devices. Those measurements can also be used in conjunction with the alloy and/or byproduct composition measurements to further refine the estimate or determination of the alloy composition and raw materials used. The XRD pattern can be taken from any area of interest around the component but typically in a 10 degree to 70 degree 0-20 XRD plot, although other forms of XRD analysis such as glancing angle or polar texture plots may be equally of applicability.

At block 230, the system 100 detects compliance to specifications or defects of the in situ physical properties with respect to pre-specified material requirements, via analysis and comparison of the actual and expected alloy and/or byproduct composition as the build progresses. In this regard, for example, compute device 101 (shown in FIG. 1) can compare pre-specified material/composition requirements of the database 109 to the in situ physical properties and determine if any compositional defects are present. At block 240, all compositional defects are analyzed (e.g., by the software 108 of the compute device 101) to determine whether corrective actions need to be taken and what those corrective actions should be, including but not limited to adjusting the composition of raw materials to keep the resulting bulk material composition, microstructure, or both within specification.

At block 250, the system 100 feeds forward and back the corrective actions, including raw material compositions to the material deposition process in real time for continuous adaptability, thereby updating the material deposition process (e.g., altering additive manufacturing depositions) to account for the defects and achieve pre-specified material requirements. At block 260, the material deposition process is implemented with the corrective actions to complete the manufacturing of the component 140.

Figure 3:
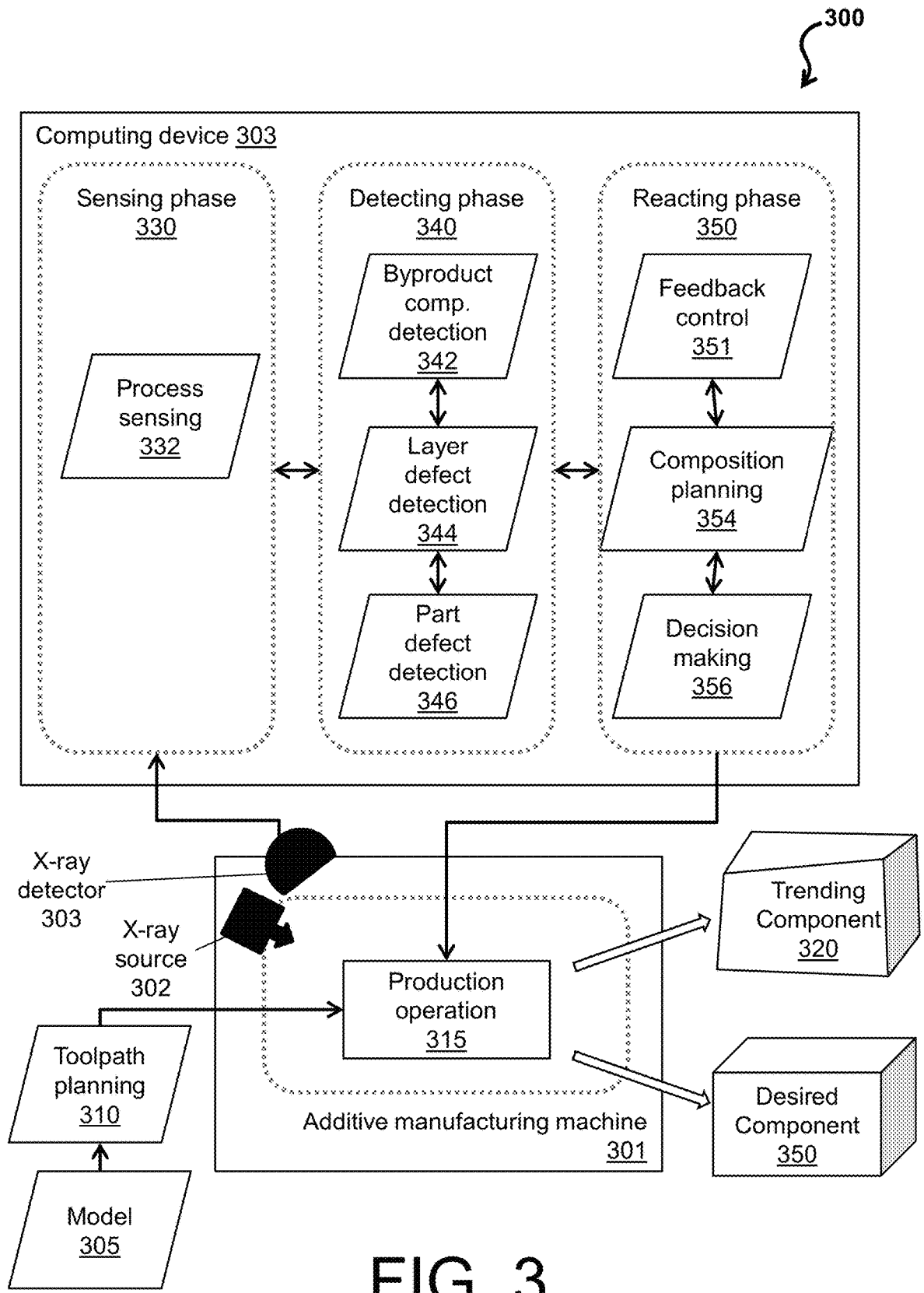
FIG. 3 depicts a schematic flow according to one or more embodiments.

Turning now to FIG. 3, a schematic flow 300 is depicted according to one or more embodiments. Schematic flow 300 is an example operation of implementing in situ monitoring of composition (and related properties) for a component (including in situ and post situ process controls) by a system. Schematic flow 300 is executed by an additive manufacturing machine 301 including at least X-ray source 302 and X-ray detector 303 (e.g., an example of the sensor device 131 of FIG. 1) and computing device 304.

In general, schematic flow 300 depicts model 305 and toolpath planning being received by additive manufacturing machine 301, utilized in production operation 315 to produce a component. Due to any number of factors during production operation 315, the additive manufacturing machine 301 may produce a trending component 320. Trending component 320 is note desired as a final component. In some cases, the desired alloy composition includes a titanium alloy or a nickel-based superalloy. As non-limiting examples, the titanium alloy can includes Ti-6Al-4V, and the nickel-based superalloy can include Inconel 718 or INCO625. The process and apparatus can also be adapted to include complex steel or aluminum alloys. In certain cases, it is expected that the process and apparatus can also be used for nonmetallic materials such as ceramic based materials.

As shown in FIG. 3, computing device 304 executes a sensing phase 330 through a process sensing 322. Process sensing 322 includes determining physical properties of the component via layer by layer estimates of composition while the component is in a formation state (See e.g., FIG. 1). X-ray source 302 generates X-rays so that an XRD pattern can be taken from any area of interest in the chamber by X-ray detector 303. Properties of the alloy and/or byproducts resulting from consolidation of raw materials are communicated by X-ray detector 303 of additive manufacturing machine 301, which is performing the in situ composition monitoring. Process sensing 322 can further include comparing pre-specified compositional requirements or related alloy and/or byproduct expectations requirements to the in situ properties to provide comparison information. Sensing phase 330 and/or process sensing 322 can be implemented by software of computing device 304.

Next, computing device 304 executes detecting phase 340, which includes composition defect detection 342, layer defect detection 344, and part defect detection 346. Detecting phase 340 identifies defects with respect to errors in the process (e.g., the composition defect detection 342), defect within one or more layers resulting from compositional variation (e.g., layer defect detection 344), and defects across the component itself (e.g., part defect detection 346). Detecting phase 340 and operations therein can be implemented by software of computing device 304.

Computing device 304 also executes reacting phase 350, which includes feedback control 352, composition planning 354, and decision making 356. Reacting phase 350 and operations therein can be implemented by software of computing device 304. Results of reacting phase 350 include corrective actions that are provided to production operation 315. The corrected actions can include adjusting an area of interest to determine where to perform the in situ compositional adjustment (e.g., by feedback control 352), adjusting a raw material composition to accommodate or correct compositional defects in trending component 320 (e.g., by composition planning 354), and determining material deposit amounts to accommodate or correct defects in trending component 320 (e.g., by decision making 356). Production operation 315 is improved by the corrective actions from the computing device, such that additive manufacturing machine 301 may now produce desired component 350 with corrected alloy composition. This updating can be performed, in one non-limiting example, through the development and incorporation of an extended powder delivery system that can adjust the alloy elements during and throughout the build process. The extended powder control system, or other system is incorporated into AM device 301 to control elements of the raw material powder during the build process, based on the in situ sensor analysis. A material delivery system, configured to provide excess amounts of at least one raw material component as needed during the build process, can also be incorporated into device 301.

The term "about" is intended to include the degree of error associated with measurement of the particular quantity based upon the equipment available at the time of filing the application.

Discussion of Possible Embodiments

The following are non-exclusive descriptions of possible embodiments of the present invention.

An additive manufacturing system includes an additive manufacturing (AM) device, a first sensor device, and a compute device. The AM device is configured to form a bulk component in a layer-by-layer manner, by at least iteratively depositing a first layer of raw material onto a working surface in a deposition chamber, consolidating the initial layer into an initial additive portion of the bulk component, then forming subsequent additive portions of the bulk component by depositing and consolidating a subsequent plurality of layers of the raw material onto the first additive portion. The first sensor device is configured to measure an actual composition of at least one first byproduct portion formed upon consolidation of one of the first or subsequent layers of raw material in the deposition chamber. The compute device includes a processor and a memory, and is communicatively coupled to the additive manufacturing device and first sensor device. The additive manufacturing device and compute device provide an in situ sensor analysis of the component while in a formation state during a build process by comparing an actual composition of the at least one first byproduct portion to an expected composition range stored in the memory. The expected composition range is determined based on at least a first approximation of byproducts expected to remain after consolidating the initial or subsequent layers of raw material powder. If the actual composition falls outside of the expected composition range, the compute device is configured to perform at least one corrective action that includes directing the additive manufacturing device to deposit at least one subsequent layer of raw material having a modified composition different from at least one of a previously deposited raw material composition or the initial layer of raw material to compensate for the variance in actual alloy composition.

The system of the preceding paragraph can optionally include, additionally and/or alternatively, any one or more of the following features, configurations and/or additional components: An embodiment of an additive manufacturing system according to an exemplary embodiment of this disclosure, among other possible things includes: an additive manufacturing device configured to perform a build process to form a bulk component in a layer-by-layer manner, by at least iteratively depositing a first layer of raw material, having a first raw material composition, onto a working surface in a deposition chamber, consolidating the first layer into a first additive portion of the bulk component, then forming subsequent additive portions of the bulk component by depositing and consolidating a subsequent plurality of layers of the raw material onto the first additive portion; a first sensor device configured to measure an actual composition of at least one first byproduct portion formed upon consolidation of one of the first layer or one of the subsequent layers of raw material in the deposition chamber; a compute device comprising a processor and a memory, the compute device being communicatively coupled to the additive manufacturing device and the sensor device; wherein the additive manufacturing device and the compute device are configured to provide an in situ sensor analysis of the component while in a formation state during the build process by: comparing an actual composition of the at least one first byproduct portion to an expected composition range of the at least one first byproduct portion stored in the memory, the expected composition range of the at least one first byproduct portion determined based on at least a first approximation of byproducts expected to remain after consolidating the initial or subsequent raw material powder, thereby determining if the actual composition of the at least one first byproduct portion falls within the expected composition range or outside of the expected composition range of the at least one first byproduct portion; wherein if the actual composition of the at least one first byproduct portion falls outside of the expected composition range of the at least one byproduct portion, the compute device is configured to perform at least one corrective action, the at least one corrective action including directing the additive manufacturing device to deposit at least one subsequent layer of raw material having a modified composition different from at least one of the first raw material composition or a previously deposited raw material composition.

A further embodiment of the foregoing system, further comprising a second sensor device configured to provide a signal to the compute device for adjusting a composition of raw material powder in the form of a feed forward method or a feed backward method.

A further embodiment of any of the foregoing systems, wherein the mode of operating the additive manufacturing device includes DMLS (direct metal layer sintering), wire arc deposition, laser engineered net shaping (LENS), plasma spray, cold spray, kinetic spray, wire metal welding, and combinations thereof.

A further embodiment of any of the foregoing systems, further comprising a source of inert gas to provide an inert gas atmosphere in the deposition chamber as the base atmospheric composition.

A further embodiment of any of the foregoing systems, further comprising at least one valve configured to provide the inert gas in a pressure range between about $10^{-4}$ torr ($1.32*10^{-7}$ atm) to about 1520 torr (2 atm).

A further embodiment of any of the foregoing systems, wherein the compute device is configured to feed forward and back the at least one corrective action to initial or preceding three-dimensional object production in real time to generate an updated three-dimensional object production.

A further embodiment of any of the foregoing systems, wherein the sensor device comprises an X-ray source and X-ray detector that together acquire a full or partial X-ray diffraction signal or pattern that is analyzed to determine in situ physical properties, including at least the actual byproduct composition.

A further embodiment of any of the foregoing systems, wherein the compute device comprises a processor executing software to provide one or more process modeling, toolpath planning, defect detection, layer defect detection, part defect detection, feedback control, scan path planning, decision making, and process sensing operations for detecting or correcting at least the initial raw material composition.

A further embodiment of any of the foregoing systems, further comprising: an extended powder control system to control elements of the raw material powder during the build process, based on the in situ sensor analysis; and a material delivery system configured to provide excess amounts of at least one raw material component as needed during the build process.

A further embodiment of any of the foregoing systems, wherein the material delivery system is in direct communication with the compute device to automatically respond to the actual at least one byproduct composition.

An embodiment of a method for operating an additive manufacturing apparatus includes in situ analysis of a component being formed by the apparatus. The method includes (a) depositing an initial layer of raw material having a composition corresponding to an initial approximation of a desired bulk composition of the component being formed; (b) consolidating the deposited initial layer of raw material to form at least an initial additive portion of the component; and at least one first byproduct portion. The method also includes, by at least one sensor device, measuring an actual composition of the at least one first byproduct portion, during or immediately after the consolidating step. The actual composition of the at least one first byproduct portion is analyzed, and includes comparing the actual composition to an expected composition range. The expected composition range is determined based on at least the initial approximation of the desired bulk composition, thereby determining if the actual composition falls within or outside the expected composition range. If the actual composition falls within the expected composition range, immediately repeat the steps to form a subsequent additive portion of the bulk component and at least one subsequent byproduct portion. If the actual composition falls outside of the expected composition range, prior to repeating at least steps (a)-(d), performing at least one corrective action which includes depositing at least one subsequent layer of raw material having a modified composition different from at least one of the first raw material composition and a previously deposited raw material composition. The method continues by repeating the steps until the component is substantially complete, wherein for each iteration the initial approximation of a desired alloy composition in the raw material is updated based on a variance between actual and expected byproduct composition.

The method of the preceding paragraph can optionally include, additionally and/or alternatively, any one or more of the following features, configurations and/or additional components:

A method according to an exemplary embodiment of this disclosure, among other possible things includes (a) depositing an initial layer of raw material, the initial layer of raw material having a composition corresponding to an initial approximation of a desired bulk composition of the component being formed; (b) consolidating the deposited initial layer of raw material to form at least: an initial additive portion of the component; and an initial at least one byproduct portion corresponding to at least one byproduct of the consolidation step; (c) by at least one sensor device, sensing an actual composition of the initial at least one byproduct portion during or immediately after the consolidating step (b); and (d) analyzing the actual composition of the initial at least one byproduct portion from step (c), including comparing the actual composition of the initial portion to an expected at least one byproduct composition range, the expected at least one byproduct composition range determined based on at least the initial approximation of the desired bulk composition, thereby determining if the actual initial at least one byproduct composition falls within the expected at least one byproduct composition range or outside of the expected at least one byproduct composition range; wherein if the actual initial at least one byproduct composition falls within the expected at least one byproduct composition range, immediately repeat steps (a)-(d) to form a subsequent additive portion of the bulk component; or if the actual initial at least one byproduct composition falls outside of the expected at least one byproduct composition range: prior to repeating steps (a)-(d), performing at least one corrective action which includes at least modifying a composition of a subsequent layer of raw material relative to the composition of the initial layer of raw material, the modification corresponding to a variance in composition between an estimated alloy composition after step (b) and the initial approximation of the desired bulk alloy composition; and continuing the method by repeating steps (a)-(d) until the component is substantially complete, wherein for each iteration the initial approximation of a desired alloy composition in the raw material in step (a) is updated based on the variance in composition.

A further embodiment of the foregoing method wherein implementing the three-dimensional object production of the component is performed according to a computer design file, the corrective actions fed forward and back in real time to update three-dimensional object production in situ.

A further embodiment of any of the foregoing methods, wherein the expected at least one byproduct composition range is also determined based on at least one of a base atmospheric composition, and a mode of performing the consolidating step (b).

A further embodiment of any of the foregoing methods, wherein the mode of performing the consolidating step (b) includes one or more of: DMLS (direct metal layer sintering), wire arc deposition, laser engineered net shaping (LENS), plasma spray, cold spray, kinetic spray, wire metal welding, and combinations thereof.

A further embodiment of any of the foregoing methods, wherein the base atmospheric composition is an inert gas atmosphere.

A further embodiment of any of the foregoing methods, wherein the base atmospheric composition is in a pressure range between about $10^{-4}$ torr ($1.32*10^{-7}$ atm) to about 1520 torr (2 atm).

A further embodiment of any of the foregoing methods, wherein the desired alloy composition includes a titanium alloy or a nickel-based superalloy.

A further embodiment of any of the foregoing methods, wherein the titanium alloy includes Ti-6Al-4V, and the nickel-based superalloy includes Inconel 718 or INCO625.

A further embodiment of any of the foregoing methods, wherein the measuring step (c) is performed using at least one sensor device comprises an X-ray source and X-ray detector that together acquire a full or partial X-ray diffraction signal or pattern corresponding to the actual initial at least one byproduct composition that is analyzed to determine in situ physical properties of the component being formed.

A further embodiment of any of the foregoing methods, wherein the in situ physical properties comprise estimates of one or more of: hardness, local strain, yield strength, density, crystallite size, porosity, defect density compositional variation, and combinations thereof.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An additive manufacturing system comprising:
an additive manufacturing device configured to perform a build process to form a bulk component in a layer-by-layer manner, by at least iteratively depositing a first layer of raw material, having a first raw material composition, onto a working surface in a deposition chamber, consolidating the first layer into a first additive portion of the bulk component, then forming subsequent additive portions of the bulk component by depositing and consolidating a subsequent plurality of layers of the raw material onto the first additive portion;
a first sensor device configured to measure an actual composition of at least one first byproduct portion formed upon consolidation of one of the first layer or one of the subsequent layers of raw material in the deposition chamber;
a compute device comprising a processor and a memory, the compute device being communicatively coupled to the additive manufacturing device and the first sensor device;
a second sensor device configured to provide a signal to the compute device for adjusting a composition of raw material in the form of a feed forward method or a feed backward method;
an extended powder control system to control elements of the raw material during the build process, based on an in situ sensor analysis; and
a material delivery system configured to provide supplemental amounts of at least one raw material component as needed during the build process;
wherein the additive manufacturing device and the compute device are configured to provide the in situ sensor analysis of the bulk component while in a formation state during the build process by:
comparing an actual composition of the at least one first byproduct portion to an expected composition range of the at least one first byproduct portion stored in the memory, the expected composition range of the at least one first byproduct portion determined based on at least a first approximation of byproducts expected to remain after consolidating initial or subsequent raw material, thereby determining if the actual composition of the at least one first byproduct portion falls within the expected composition range or outside of the expected composition range of the at least one first byproduct portion; wherein
if the actual composition of the at least one first byproduct portion falls outside of the expected composition range of the at least one byproduct portion, the compute device is configured to perform at least one corrective action, the at least one corrective action including directing the additive manufacturing device to deposit at least one subsequent layer of raw material having a modified composition different from at least one of the first raw material composition or a previously deposited raw material composition.

2. The apparatus of claim 1, wherein the mode of operating the additive manufacturing device includes DMLS (direct metal layer sintering), wire arc deposition, laser engineered net shaping (LENS), plasma spray, cold spray, kinetic spray, wire metal welding, and combinations thereof.

3. The apparatus of claim 1, further comprising a source of inert gas to provide an inert gas atmosphere in the deposition chamber as a base atmospheric composition.

4. The apparatus of claim 3, further comprising at least one valve configured to provide the inert gas in a pressure range between about $10^{-4}$ torr ($1.32*10^{-7}$ atm) to about 1520 torr (2 atm).

5. The apparatus of claim 1, wherein the compute device is configured to feed forward and back the at least one corrective action to initial or preceding three-dimensional object production in real time to generate an updated three-dimensional object production.

6. The apparatus of claim 1, wherein the first sensor device comprises an X-ray source and X-ray detector that together acquire a full or partial X-ray diffraction signal or pattern that is analyzed to determine in situ physical properties, including at least the actual byproduct composition.

7. The apparatus of claim 6, wherein the compute device comprises a processor executing software to provide one or more process modeling, toolpath planning, defect detection, layer defect detection, part defect detection, feedback control, scan path planning, decision making, and process sensing operations for detecting or correcting at least the first raw material composition.

8. The apparatus of claim 1, wherein the material delivery system is in direct communication with the compute device to automatically respond to the actual composition of the at least one first byproduct portion.

9. The apparatus of claim 1, wherein the at least raw material component comprises an alloying element.

10. A method for operating an additive manufacturing apparatus including in situ analysis of a component being formed by the apparatus, the method comprising:
(a) depositing an initial layer of raw material, the initial layer of raw material having a first raw material composition corresponding to an initial approximation of a desired bulk composition of the component being formed;
(b) consolidating the deposited initial layer of raw material to form at least:
a first additive portion of the component; and
at least one first byproduct portion;

(c) by at least one sensor device, measuring an actual composition of the at least one first byproduct portion, during or immediately after the consolidating step (b);

(d) analyzing the actual composition of the at least one first byproduct portion measured in step (c), including comparing the actual composition of the at least one first byproduct portion to an expected composition range of the at least one first byproduct portion, the expected composition range of the at least one byproduct determined based on at least the initial approximation of the desired bulk composition, thereby determining if the actual composition of the at least one first byproduct portion falls within the expected composition range of the at least one first byproduct portion or outside of the expected composition range of the at least one first byproduct portion;

wherein if the actual composition of the at least one first byproduct portion falls within the expected composition range, immediately repeat steps (a)-(d) to form a subsequent additive portion of the bulk component and a subsequent at least one byproduct portion; or if the actual composition of the at least one first byproduct portion falls outside of the expected composition range:

prior to repeating steps (a)-(d), performing at least one corrective action which includes depositing at least one subsequent layer of raw material relative to the composition of the initial layer of raw material having a modified composition different from at least one of the first raw material composition and a previously deposited raw material composition; and continuing the method by repeating steps (a)-(d) until the component is substantially complete, wherein for each iteration the initial approximation of a desired alloy composition in the raw material in step (a) is updated based on a variance between actual and expected byproduct composition;

(e) providing, by the at least one sensor device, a signal to a compute device to adjust a composition of raw material in the form of a feed forward method or a feed backward method;

(f) controlling, using an extended powder control system, elements of the raw material during the build process, based on the in situ sensor analysis; and (g) providing, using a material delivery system, supplemental amounts of at least one raw material component as needed during the build process.

11. The method of claim 10, wherein implementing a three-dimensional object production of the component is performed according to a computer design file, the corrective actions fed forward and back in real time to update three-dimensional object production in situ.

12. The method of claim 10, wherein the expected composition range of the at least one first byproduct portion is also determined based on at least one of a base atmospheric composition, and a mode of performing the consolidating step (b).

13. The method of claim 12, wherein the mode of performing the consolidating step (b) includes one or more of: DMLS (direct metal layer sintering), wire arc deposition, laser engineered net shaping (LENS), plasma spray, cold spray, kinetic spray, wire metal welding, and combinations thereof.

14. The method of claim 12, wherein the base atmospheric composition is an inert gas atmosphere.

15. The method of claim 12, wherein the base atmospheric composition is in a pressure range between about $10^{-4}$ torr ($1.32*10^{-7}$ atm) to about 1520 torr (2 atm).

16. The method of claim 10, wherein the desired alloy composition includes a titanium alloy or a nickel-based superalloy.

17. The method of claim 16, wherein the titanium alloy includes Ti-6Al-4V, and the nickel-based superalloy includes Inconel 718 or INCO625.

18. The method of claim 10, wherein the measuring step (c) is performed using at least one sensor device comprises an X-ray source and X-ray detector that together acquire a full or partial X-ray diffraction signal or pattern corresponding to the actual initial at least one byproduct composition that is analyzed to determine in situ physical properties of the component being formed.

19. The method of claim 18, wherein the in situ physical properties comprise estimates of one or more of: hardness, local strain, yield strength, density, crystallite size, porosity, defect density compositional variation, and combinations thereof.

* * * * *